US010535747B2

(12) United States Patent
Liu et al.

(10) Patent No.: US 10,535,747 B2
(45) Date of Patent: Jan. 14, 2020

(54) TRANSISTOR WITH DUAL-GATE SPACER

(71) Applicant: INTEL CORPORATION, Santa Clara, CA (US)

(72) Inventors: En-Shao Liu, Portland, OR (US); Joodong Park, Portland, OR (US); Chen-Guan Lee, Portland, OR (US); Chia-Hong Jan, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/778,306

(22) PCT Filed: Dec. 23, 2015

(86) PCT No.: PCT/US2015/000170
§ 371 (c)(1),
(2) Date: May 23, 2018

(87) PCT Pub. No.: WO2017/111770
PCT Pub. Date: Jun. 29, 2017

(65) Prior Publication Data

US 2018/0374927 A1 Dec. 27, 2018

(51) Int. Cl.
*H01L 29/49* (2006.01)
*H01L 21/28* (2006.01)
(Continued)

(52) U.S. Cl.
CPC .... *H01L 29/4991* (2013.01); *H01L 21/28088* (2013.01); *H01L 21/764* (2013.01);
(Continued)

(58) Field of Classification Search
CPC ................................................ H01L 21/28088
See application file for complete search history.

(56) References Cited

U.S. PATENT DOCUMENTS 6,124,176 A * 9/2000 Togo .................. H01L 29/4983
257/E21.433
9,716,158 B1 * 7/2017 Cheng ................ H01L 29/4991
(Continued)

FOREIGN PATENT DOCUMENTS

WO 2017/111770 A1 6/2017

OTHER PUBLICATIONS

International Search Report and Written Opinion received for PCT Application No. PCT/US2015/000170, dated Aug. 31, 2016. 13 pages.

(Continued)

*Primary Examiner* — Thao P Le
(74) *Attorney, Agent, or Firm* — Finch & Maloney PLLC

(57) ABSTRACT

Techniques are disclosed for forming a transistor with one or more additional gate spacers. The additional spacers may be formed between the gate and original gate spacers to reduce the parasitic coupling between the gate and the source/drain, for example. In some cases, the additional spacers may include air gaps and/or dielectric material (e.g., low-k dielectric material). In some cases, the gate may include a lower portion and an upper portion. In some such cases, the lower portion of the gate may be narrower in width between the original gate spacers than the upper portion of the gate, which may be as a result of the additional spacers being located between the lower portion of the gate and the original gate spacers. In some such cases, the gate may approximate a “T” shape or various derivatives of that shape such as ⌝-shape or ⌜-shape, for example.

21 Claims, 8 Drawing Sheets

(51) Int. Cl.
*H01L 21/764* (2006.01)
*H01L 29/78* (2006.01)
*H01L 29/66* (2006.01)

(52) U.S. Cl.
CPC ...... *H01L 29/4966* (2013.01); *H01L 29/7851* (2013.01); *H01L 29/66795* (2013.01)

(56) References Cited

U.S. PATENT DOCUMENTS

| | | | | |
|---|---|---|---|---|
| 2012/0049247 | A1 | 3/2012 | Lee et al. | |
| 2012/0264286 | A1* | 10/2012 | Yeo | H01L 29/6653 438/595 |
| 2015/0145073 | A1* | 5/2015 | Lee | H01L 29/6656 257/411 |
| 2015/0228754 | A1 | 8/2015 | Sung | |
| 2018/0090587 | A1* | 3/2018 | Bonilla | H01L 29/4991 |

OTHER PUBLICATIONS

International Preliminary Report on Patentability received for PCT Application No. PCT/US2015/000170, dated Jun. 26, 2018. 9 pages.

* cited by examiner

TRANSISTOR WITH DUAL-GATE SPACER

BACKGROUND

Semiconductor devices are electronic components that exploit the electronic properties of semiconductor materials, such as silicon (Si), germanium (Ge), and gallium arsenide (GaAs). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. Some FETs have a fourth terminal called, the body or substrate, which can serve to bias the transistor into operation. A metal-oxide-semiconductor FET (MOSFET) uses an insulator between the gate and the body of the transistor and MOSFETs are typically used for amplifying or switching electronic signals. MOSFETs are one of the most common transistors in both digital and analog circuits. In some cases, MOSFETs include side-wall spacers, referred to generally as spacers, on either side of the gate that can help determine the channel length and can help with replacement gate processes, for example.

Figure 1A:
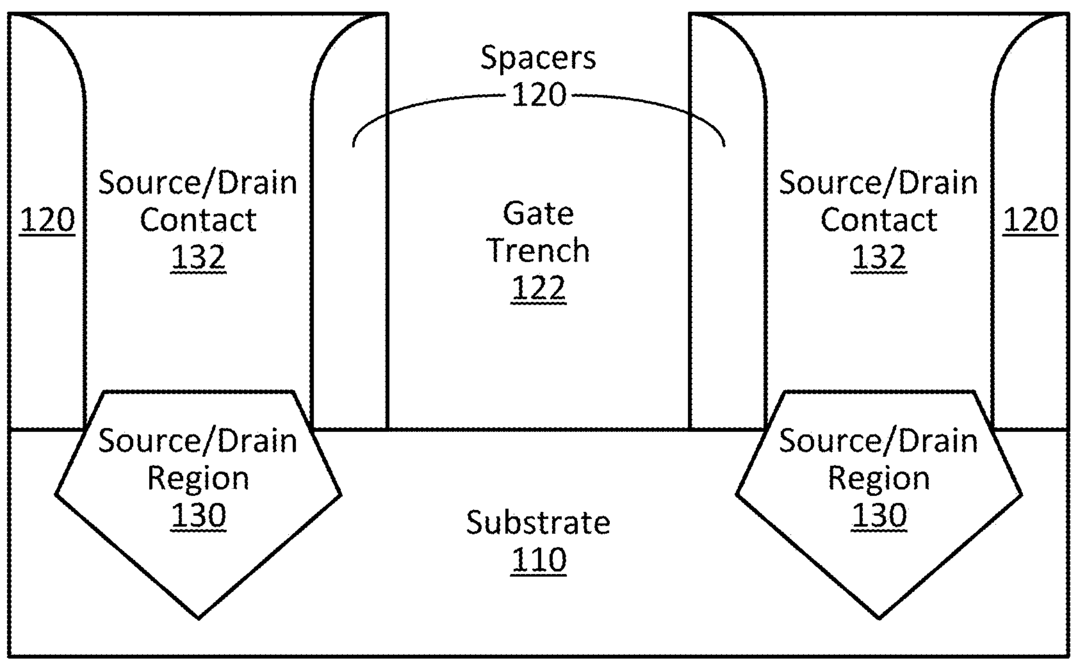
FIGS. 1A-G illustrate example integrated circuit structures resulting from a method configured to form a transistor including dielectric material additional spacers so as to provide a dual-gate spacer, in accordance with some embodiments of this disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming a transistor with one or more additional gate spacers. The additional gate spacers are in addition to the standard (original) gate spacers normally provided on sides of the gate stack. Thus, resulting configuration is generally referred to herein as a dual-gate spacer configuration. The additional gate spacers may be formed between the gate and original gate spacers to reduce the parasitic coupling between the gate and the source/drain, for example. In some cases, the additional gate spacers may include air gaps and/or dielectric material (e.g., low-k dielectric material). In some cases, the gate may include a lower portion and an upper portion, where the lower portion is closer to the channel region than the upper portion. In some such cases, the lower portion of the gate may be narrower in width between the original gate spacers than the upper portion of the gate, which may be as a result of the additional gate spacers being located between the lower portion of the gate and the original gate spacers. In addition, in some such cases, the upper portion of the gate may be wider between the original gate spacers than the lower portion of the gate (e.g., as a result of the deposition of additional gate material), which may form a gate that approximates a "T" shape, for example. Numerous variations and configurations will be apparent in light of this disclosure.

General Overview

Numerous non-trivial challenges are present in fabricating semiconductor transistors particularly as the industry attempts to keep up with Moore's law. For example, as dimensions of transistors, such as MOSFETs, keep scaling down, it becomes more and more challenging for traditional lithography to reliably print small critical dimensions. A major factor in transistor delay is the parasitic capacitance around the gate, with a large contribution of the delay coming from the gate and source capacitance and/or the gate and drain capacitance, generally referred to herein as the gate-source/drain capacitance. Dielectric material referred to as side-wall spacers, gate spacers, or generally, spacers, can be formed on either side of the gate (between the gate and source/drain) to help lower the gate-source/drain capacitance, but such spacers have limits, particularly as dimensions of transistors keep scaling down. Some issues caused by continuous scaling of transistors has been addressed by relying on advances in lithography development. However, new lithography tools and next-generation lithography (NGL) techniques used to assist with achieving smaller critical dimensions during transistor formation, such as extreme ultraviolet lithography (EUVL), electron-beam lithography (EBL), and x-ray lithography, are costly and/or have low throughput issues.

Thus, and in accordance with one or more embodiments of this disclosure, techniques are provided for forming a transistor with one or more additional gate spacers, so as to provide a dual-gate spacer configuration. As previously described, side-wall spacers, sometimes referred to as gate spacers, or more generally, spacers, may be formed on either side of a transistor gate to help lower the gate-source/drain capacitance (or for other reasons, such as to help determine channel length and help with replacement gate processes, for example). In some embodiments, additional spacers can be formed inside of the original gate spacers and on either side of at least a portion of the gate to, for example, further reduce gate/-source/drain parasitic capacitance. In some embodiments, the inclusion of the additional spacers may cause the gate to approximate a "T" shape, as will be apparent in light of the present disclosure. Further, in some such embodiments, the T-shaped gate may include a lower portion and an upper portion, where the lower portion is narrower in width (dimension between the original gate spacers) than the upper portion, as a result of the inclusion of the additional spacers, thereby forming an approximate T-shape when a cross section is taken in an orthogonal-to-gate direction. In some embodiments, the additional spacers may include air gaps and/or dielectric material (e.g., a low-k dielectric), for example. In some embodiments, a dielectric liner may be deposited prior to forming the gate stack (which may include the gate dielectric layer, an optional work-function layer, and the gate). In some such embodiments, the dielectric liner material may include different material than the material of the original gate spacers, to enable selectively etching the dielectric liner material relative to surrounding materials (e.g., to recess or substantially/completely remove the dielectric liner material), as will be described in more detail herein. In some embodiments, the upper portion of the T-shaped gate may be formed using angled deposition techniques to, for example, add gate material at the gate contact location and increase contact surface area.

As previously described, in some embodiments, the term T-shaped is used to refer to gates formed using techniques described herein. However, in some such embodiments, the T-shape descriptor is not intended to limit such gates to an exact or perfect "T" shape. Instead, the T-shape descriptor is intended to be a general approximation of the shape of the gate, in some embodiments. Numerous variations on the shape of the gate will be apparent in light of this disclosure, and in some embodiments, the variations may be desired, while in other embodiments, the variations may be a result of real-world fabrication techniques. For example, in some embodiments, the additional spacer on one side of the gate may have a different width (dimension between gate and original gate spacer) and/or height (dimension substantially perpendicular to the width) than the additional spacer on the opposing side of the gate. In some such embodiments, an asymmetrical T-shaped gate may be formed. Further, in some embodiments, an additional spacer may only be formed on one side of the gate and not the other, such that the gate will only include one half of a "T" shape, for example (e.g., ˥-shape or ┌-shape). In some embodiments, additional gate material may be deposited in the upper portion of the T-shaped gate to reduce contact resistance to the gate, for example. However, in some embodiments, the upper portion of the T-shaped gate may not be formed, such that the gate may more closely approximate a vertical line, for example. Thus, numerous gate shapes can be manifested using one or more additional, additional spacers as provided herein. The resulting gate shape may be symmetrical or asymmetrical, and may have one or more relatively thin gate regions below a relatively wider gate region, depending on the forming process employed, as will be appreciated in light of this disclosure and the various example embodiments provided.

Numerous benefits will be apparent in light of this disclosure. For example, in some embodiments, the additional gate spacer may reduce the undesired parasitic capacitance coupling at the gate-source/drain interface and may also increase the intrinsic transistor speed. In some embodiments, a wide range of additional spacer materials may be enabled, such as various dielectric materials (e.g., low-k dielectrics or high-k dielectrics), air gaps, or any other suitable material depending on the end use or target application. In some embodiments, the area for source/drain contact materials may be maximized, as the additional spacers are formed as inner spacers inside of the original gate spacers. In some such embodiments, maximizing the area for source/drain contact materials can beneficially reduce the contact resistance to the source/drain regions. As previously described, in some embodiments, the techniques maintain the top area of the gate material, so the impact to the contact resistance between local interconnects and the gate is minimal or trivial (or there may be no impact, in some cases). In some embodiments, the techniques enable the use of photolithography techniques to address the issue of transistor delay caused by parasitic capacitance from the gate-source and/or gate-drain interface as opposed to attempting to address such issues using costly and/or low throughput next-generation lithography (NGL) techniques (e.g., EUVL, EBL, and x-ray lithography techniques). In some embodiments, the additional gate spacer can serve as a second spacer between the gate and source/drain to further scale down the width of the gate between the original spacers, which is sometimes referred to as the gate length (Lg). In some such embodiments, the effective channel length or width may also be scaled down, which may provide benefits as will be apparent in light of the present disclosure.

Use of the techniques and structures provided herein may be detectable using tools such as scanning/transmission electron microscopy (SEM/TEM), composition mapping, x-ray crystallography or diffraction (XRD), secondary ion mass spectrometry (SIMS), time-of-flight SIMS (ToF-SIMS), atom probe imaging or tomography, local electrode atom probe (LEAP) techniques, 3D tomography, high resolution physical or chemical analysis, to name a few suitable example analytical tools. In particular, in some embodiments, such tools may indicate a structure or device configured with one or more additional gate spacers between the original gate spacers of a transistor and the transistor gate, so as to provide a dual gate spacer configuration. Note that as used herein, dual-gate spacer configuration is intended to refer to two or more gate spacers, and is not limited to simply two gate spacers, unless specifically defined to so be limited according to an example embodiment. In some such embodiments, the additional spacers may be located between the gate dielectric and the original gate spacers. Further, in some such embodiments, the additional spacers may include air gaps and/or dielectric material (e.g., low-k dielectric material). In some embodiments, the techniques may form a gate having a lower portion (where the lower portion is closest to the transistor channel region or gate dielectric) that has a narrower width between the spacers than an upper portion of the gate. In some such embodiments, the upper portion may include additional gate material formed to, for example, increase contact surface area. As can be understood based on the present disclosure, in some such embodiments, the additional spacers occupy space that would otherwise be occupied by gate material, thereby creating the narrower lower portion of the gate. In some such embodiments, the gate may be approximately T-shaped, for example. In some embodiments, the techniques described herein may be detected based on the materials of the different transistor features, for example. In some embodiments, the technique can be detected by measuring the benefits achieved, such as the improvements in parasitic capacitance coupling at the gate-source/drain interface, for example. Numerous configurations and variations will be apparent in light of this disclosure.

Architecture and Methodology

FIGS. 1A-G illustrate example integrated circuit structures resulting from a method configured to form a transistor including dielectric material additional spacers so as to provide a dual-gate spacer, in accordance with some embodiments of this disclosure. FIGS. 2A-B illustrate example integrated circuit structures resulting from a method configured to form a transistor including air gap additional spacers so as to provide a dual-gate spacer, in accordance with some embodiments of this disclosure. The illustrations provided in FIGS. 1A-G and 2A-B are along the orthogonal-to-gate direction, illustrating a cross-sectional view that may be achieved, for example, using SEM or TEM. In some embodiments, the additional spacers may result in a T-shaped gate, as will be described in more detail herein. Note that, in some embodiments, although the final gate structure is primarily depicted as approximately T-shaped (e.g., in FIGS. 1G and 2B), numerous variations on the gate shape and additional spacer configurations will be apparent in light of this disclosure (e.g., as described with reference to FIGS. 3A-D). Also note that although the integrated circuit structures are primarily depicted in the context of forming a transistor having a planar configuration, the present disclosure is not intended to be so limited. For example, in some embodiments, the techniques described herein may be used to form a transistor having a non-planar configuration, such as a dual-gate configuration, finned configuration (e.g., finFET or tri-gate), or gate-all-around configuration (e.g., including one or more nanowires or nanoribbons), as will be described in more detail with reference to FIG. 4. Further, in some embodiments, the techniques can be used to form p-type and/or n-type transistor devices, such as p-type MOSFET (p-MOS), n-type MOSFET (n-MOS), p-type tunnel FET (p-TFET), or n-type TFET (n-TFET), to name a few examples. Further yet, in some embodiments, the techniques may be used to benefit either or both of p-type and n-type transistors included in complementary MOS (CMOS) or complementary TFET (CTFET) devices, for example. Further still, in some embodiments, the techniques may be used with devices of varying scales, such as transistor devices having critical dimensions in the micrometer range or in the nanometer range (e.g., transistors formed at the 32, 22, 14, 10, 7, or 5 nm process nodes, or beyond).

Figure 2A:
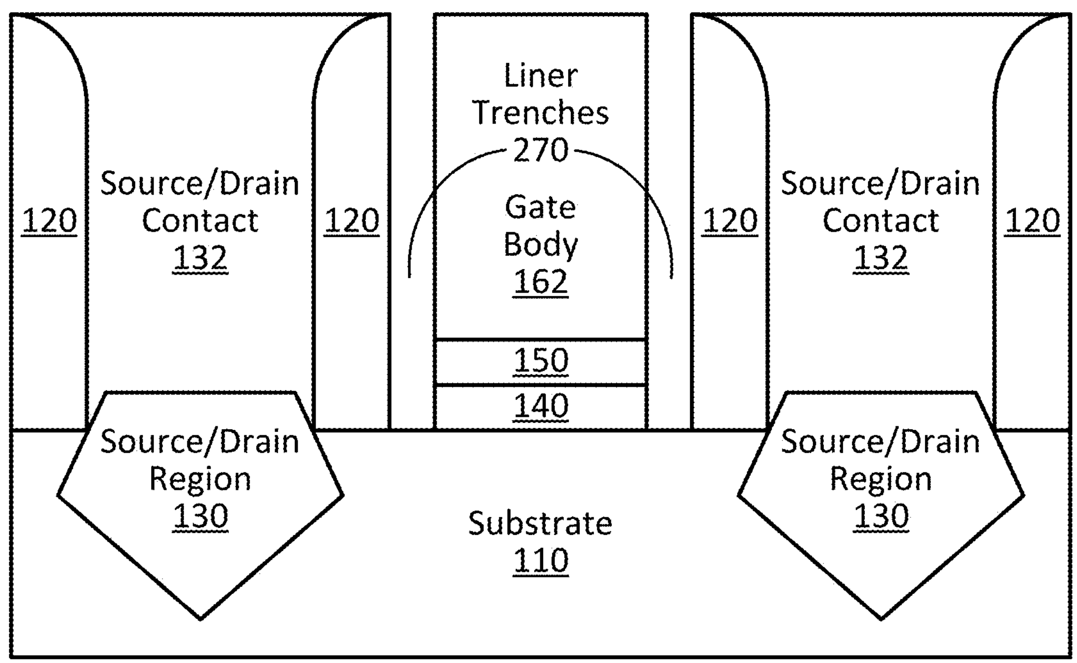
FIGS. 2A-B illustrate example integrated circuit structures resulting from a method configured to form a transistor including air gap additional spacers so as to provide a dual-gate spacer, in accordance with some embodiments of this disclosure.
Figure 2B:
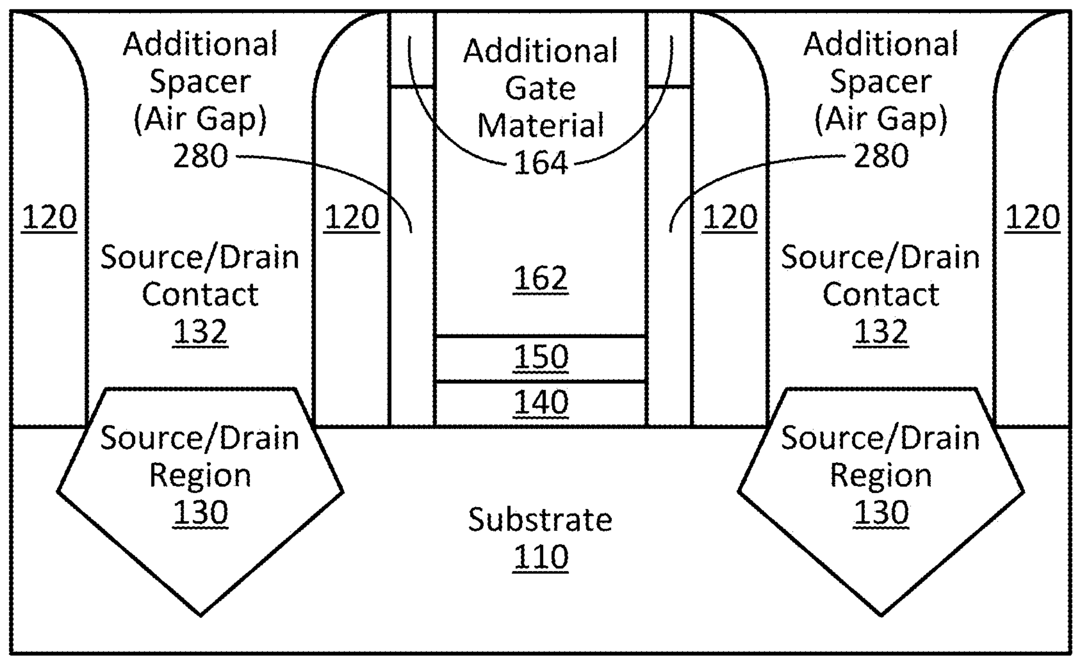

FIG. 1A illustrates an example integrated circuit structure after source/drain processing has been performed and after the gate region has been opened to form the example resulting structure shown, in accordance with an embodiment. As shown, the example structure includes substrate 110, source/drain regions 130 located above and in substrate 110, source/drain contacts 132 located on the source/drain regions 130, and spacers 120 adjacent to the source/drain contacts 132 and also adjacent to the gate trench 122. As can be understood based on FIG. 1A, in some embodiments, the structure may have included a dummy gate stack prior to removal to form gate trench 122 in the structure shown. In some such embodiments, formation of the dummy gate stack may have included dummy gate oxide deposition, dummy gate electrode (e.g., poly-Si) deposition, and patterning hardmask deposition, for example. Such deposition processes may include any suitable deposition techniques, such as chemical vapor deposition (CVD), atomic layer deposition (ALD), physical vapor deposition (PVD), and/or any other suitable process, depending on the dummy gate being formed. Additional processing may include patterning the dummy gate material to form the shape of the gate trench 122 shown, for example. As can be understood based on this disclosure, the dummy gate was used as a sacrificial structure, which may have allowed for the formation of other components, such as spacers 120. As can also be understood, the dummy gate may have protected the gate region (e.g., the surface under gate trench 122) during processing, such as during the source/drain 130, 132 processing. Note that although the techniques are illustrated in this example embodiment in a gate last process flow, in some embodiments, the techniques may be performed in a gate first process flow, such that the additional spacers are formed prior to source/drain processing, for example, or at any other suitable stage of the transistor fabrication process flow.

In some embodiments, substrate 110 may include: a bulk substrate including a group IV material or compound, such as silicon (Si), germanium (Ge), silicon carbide (SiC), or SiGe and/or at least one group III-V compound and/or sapphire and/or any other suitable material(s) depending on the end use or target application; an X on insulator (XOI) structure where X is one of the aforementioned materials (e.g., group IV and/or group III-V and/or sapphire) and the insulator material is an oxide material or dielectric material or some other electrically insulating material; or some other suitable multilayer structure where the top layer includes one of the aforementioned materials (e.g., group IV and/or group III-V and/or sapphire). Note that group III-V compounds/materials include at least one group III element (e.g., aluminum, gallium, indium, boron, thallium) and at least one group V element (e.g., nitrogen, phosphorus, arsenic, antimony, bismuth), such as gallium nitride (GaN), gallium arsenide (GaAs), indium gallium nitride (InGaN), and so forth. Although substrate 110 in this example embodiment as having a thickness (the vertical dimension, as shown) similar to the other features for ease of illustration, in some instances, substrate 110 may be much thicker than the other features, such as having a thickness in the range of 50 to 950 microns, for example. In some embodiments, substrate 110 may be used for one or more other integrated circuit (IC) devices, such as various diodes (e.g., light-emitting diodes (LEDs) or laser diodes), various transistors (e.g., MOSFETs or TFETs), various capacitors (e.g., MOSCAPs), various mi croelectromechanical systems (MEMS), various nanoelectromechanical systems (NEMS), various sensors, or any other suitable semiconductor or IC devices, depending on the end use or target application. Accordingly, in some embodiments, the transistor structures described herein may be included in a system-on-chip (SoC) application, as will be apparent in light of this disclosure.

Figure 4:
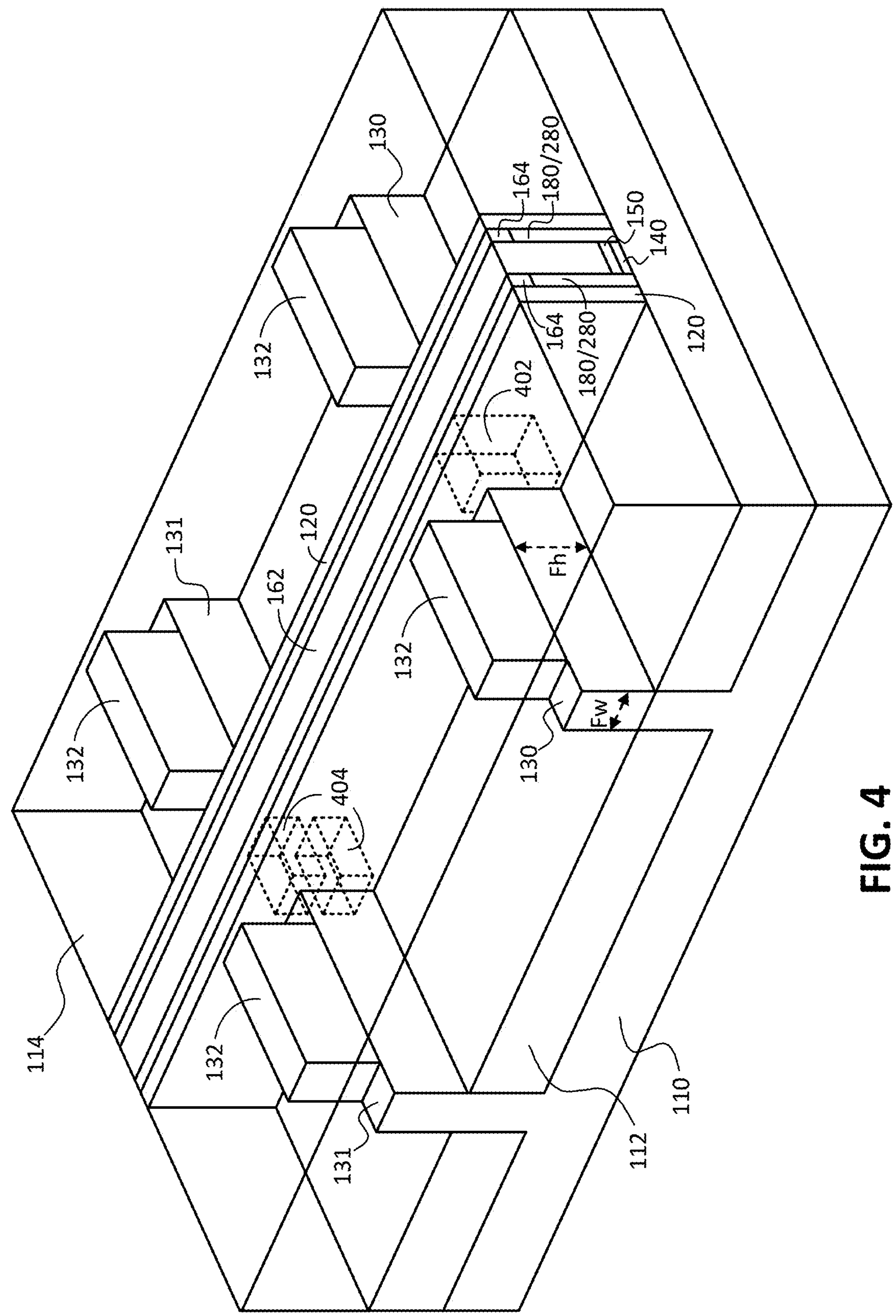
FIG. 4 illustrates example non-planar transistor architectures including additional spacers, in accordance with some embodiments of this disclosure.

In some embodiments, spacers 120 may be formed using a dummy gate stack, as previously described. The material of spacers 120, in some embodiments, may include any suitable materials, such as dielectric materials, oxides (e.g., a silicon oxide material), and/or nitrides (e.g., a silicon nitride material). In some embodiments, gate trench 122 may be formed by removing a dummy gate stack, as previously described, using, for example, wet and/or dry etch processes. Note that in some embodiments, the areas outside of gate trench 122 (e.g., the source/drain contact 132 areas) may be covered by an insulating material, such as an inter-layer dielectric (ILD) material, to allow for subsequent processing, as illustrated in FIG. 4 and described below.

As can be seen in this example embodiment, source/drain regions 130 may have been formed by etching out a portion of substrate 110 and depositing (or growing or regrowing) the source/drain region 130 material, using, for example an epitaxial deposition process such as CVD, metal-organic chemical vapor deposition (MOCVD), or molecular-beam epitaxy (MBE), to name a few example processes. In some embodiments, the source/drain epitaxial regions may be grown after performing an etch-under-cut (EUC) process. In some such embodiments, the source/drain regions may extend under spacers 136 and/or under the gate stack, and such extended portions may be referred to as source/drain tips or extensions, for example. In some embodiments, the source/drain may be completely in the substrate, may be a portion of the substrate (e.g., including doping or otherwise altered), may be over the substrate, or any combination thereof. In some embodiments, source/drain regions 130 may include any suitable materials and suitable dopants, depending on the end use or target application. For example, in an embodiment where substrate 110 includes silicon and the transistor device is to be a p-type MOSFET, source/drain regions 130 may both include p-type doped silicon (e.g., where boron is the p-type dopant). In another example embodiment, where substrate 110 includes silicon and the transistor device is to be an n-type MOSFET, source/drain regions may both include n-type doped silicon (e.g., where phosphorus is the n-type dopant). In some embodiments, any suitable source/drain 130 material and optional doping schemes may be used, depending on the end use or target application. For example, in TFET configurations, the source and drain regions 130 may be oppositely type doped (e.g., source is p-type doped and drain is n-type doped), with the channel region being minimally doped or undoped (or intrinsic/i-type).

In some embodiments, the source/drain region 130 material may be native to substrate 110 and may or may not include doping (e.g., via implantation), or the source/drain region 130 material may be formed using replacement material, which may or may not include removing a portion of the substrate to form source/drain trenches for deposition/growth of the replacement source/drain regions 130. In some embodiments, source/drain regions 130 may include a multi-layer structure of two or more material layers. In some embodiments, source/drain regions 130 may include grading (e.g., increasing and/or decreasing) the content of one or more materials in at least a portion of the regions 130. For instance, in some embodiments, a passivation material may be deposited prior to the deposition of the primary source/drain material to assist with the quality of the interface between the source/drain material and the substrate material, for example, depending on the end use or target application. Further, in some embodiments, a contact-improving material may be formed on the top of the source/drain region material to assist with making contact to source/drain contacts 132, for example, depending on the end use or target application. In some embodiments, source/drain regions 130 may extend under spacers 120 and may even extend under the gate region (e.g., under gate trench 122 in FIG. 1A), and such extended source/drain portions may be referred to as source/drain extensions or tips. For example, in the structure shown in the embodiment of FIG. 1A, the source/drain regions partially extend under spacers 120 (e.g., they extend about halfway under the spacers 120). The techniques described herein are not intended to be limited to any specific source/drain configuration.

In some embodiments, source/drain contacts 132 may be formed using any suitable techniques, such as using any suitable deposition processes (e.g., CVD, ALD, or PVD). In some embodiments, source/drain contacts 132 may include any suitable material, such as a conductive metal or alloy (e.g., aluminum, tungsten, silver, nickel-platinum, or nickel-aluminum). In some embodiments, metallization of the source/drain contacts 132 may be carried out, for example, using a silicidation or germanidation process (e.g., generally, deposition of contact metal followed by annealing).

Figure 1B:
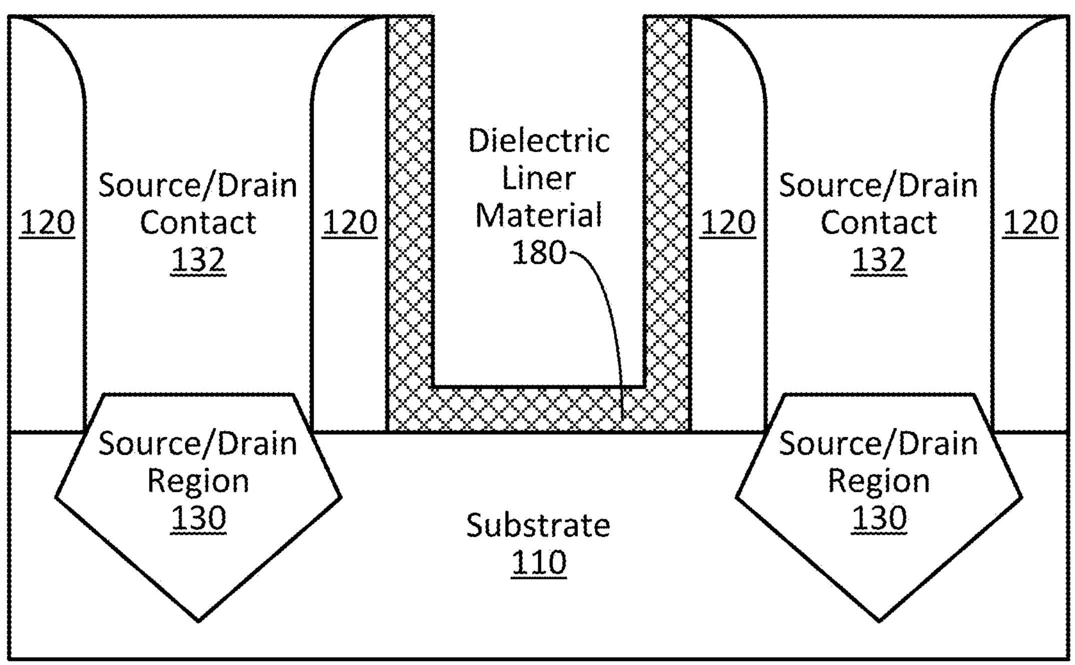

FIG. 1B illustrates an example structure after dielectric liner material 180 has been formed in the gate trench 122 of the structure of FIG. 1A, in accordance with an embodiment. In some embodiments, the dielectric liner material 180 may be deposited or grown in a conformal manner, such that the layer is deposited as shown in FIG. 1B, for example. In some embodiments, the dielectric liner material 180 may be deposited or grown using any suitable processes (e.g., CVD, ALD, or PVD) in a majority of or the entirety of the gate trench 122 space above the substrate 110, and additional processing may then be performed to form the shape of the dielectric liner material 180 shown (e.g., planarize/polish followed by a dry etch process to remove gate liner layer material). In some embodiments, the dielectric material 180 may be any suitable dielectric, such as silicon dioxide (having a dielectric constant, k, of 3.9), a low-k dielectric (materials having a dielectric constant lower than that of silicon dioxide; $k<3.9$), or a high-k dielectric (materials having a dielectric constant higher than that of silicon dioxide; $k>3.9$), depending on the end use or target application. In some such embodiments where the dielectric material 180 is a low-k dielectric, the material may include carbon and/or fluorine-doped silicon dioxide, porous silicon dioxide, porous carbon and/or fluorine-doped silicon dioxide, or any other suitable low-k dielectric material. In some embodiments, the dielectric material 180 may include a multi-layer structure of two or more material layers. In some embodiments, the dielectric material 180 may include grading (e.g., increasing and/or decreasing) the content of one or more materials in at least a portion of the material 180.

Figure 1C:
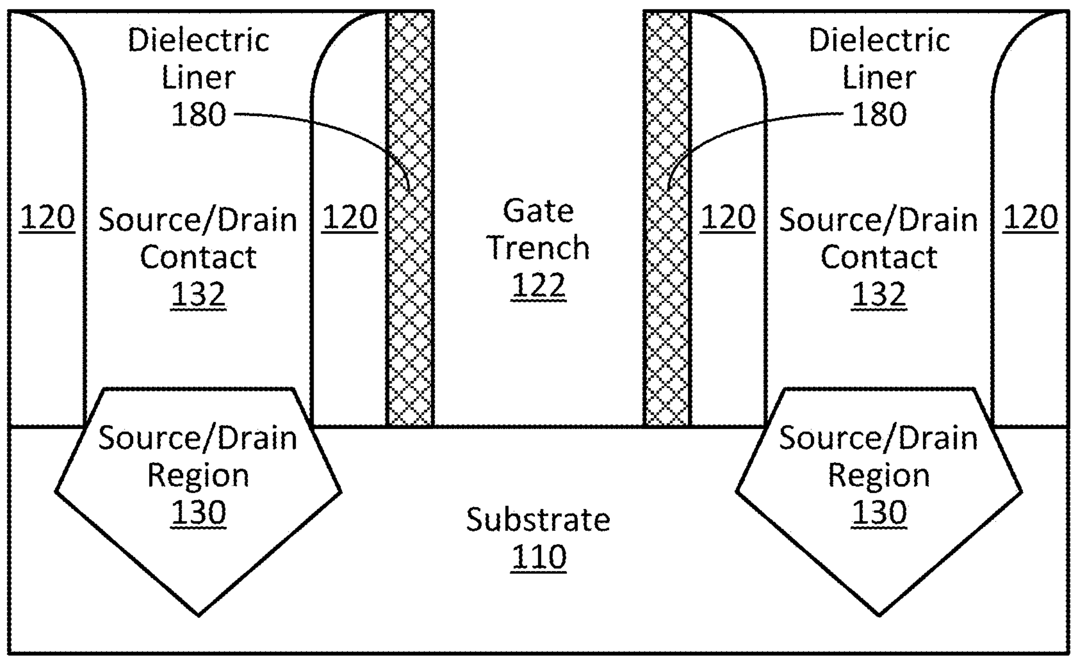

FIG. 1C illustrates an example structure after the dielectric liner material 180 of the structure of FIG. 1B has been etched to remove the middle portion (between spacers 120) at the bottom of the gate trench 122 while keeping the side-wall portion of the liner 180 intact, in accordance with an embodiment. In some such embodiments, any suitable etch process may be used, such as a dry etch process (e.g., an anisotropic etch process), for example. Note that although the dielectric liner material 180 is shown in this example embodiment as completely removed in the middle portion from the substrate surface, in some embodiments, at least a portion of the dielectric liner material 180 may be maintained on the upper surface of the substrate in gate trench 122. For example, in cases where the dielectric liner material 180 is a silicon dioxide or a hi-k dielectric, the material may be used as a part of the gate stack such that the layer is used in conjunction with the gate dielectric 140 or in place of the gate dielectric 140, in some embodiments. Also note that the presence of dielectric liner 180 on the side-walls of gate trench 122 effectively reduces the gate dimension (gate width between spacers 120) by two times the dielectric liner 180 width.

Figure 1D:
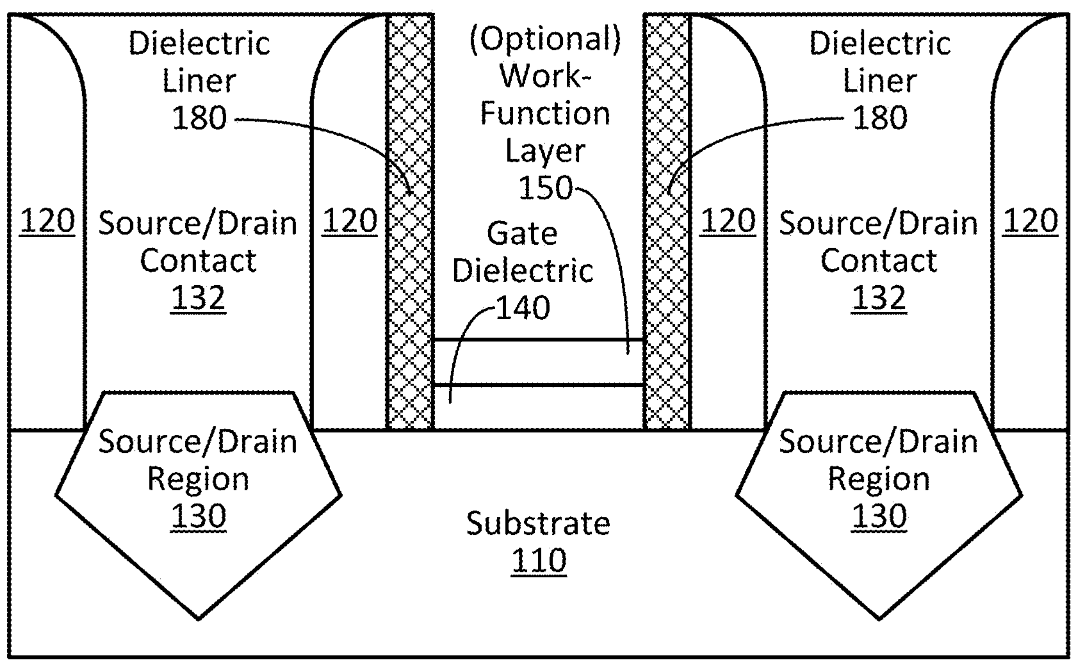

FIG. 1D illustrates an example structure after the gate dielectric layer 140 and optional work-function layer 150 have been formed in the gate trench 122 of the structure of FIG. 1C, in accordance with an embodiment. In some embodiments, gate dielectric layer 140 and optional work-function layer 150 may be formed using any suitable techniques, such as using any suitable deposition processes (e.g., CVD, ALD, or PVD). In some embodiments, the material of layers 140 and/or 150 may be conformal to the inside of gate trench 122, such that some material is formed on the sides of the gate trench 122. In some such embodiments, the material on the sides of the gate trench 122 may be removed using a wet or dry etch process, for example. In other embodiments, some material or material layers (e.g., the gate dielectric layer 140) may remain on the trench sides. For example, in some such embodiments, where a portion of the gate dielectric layer 140 is on the gate trench 122 sides, the gate dielectric layer 140 may approximate a U-shape, or if the layer 140 was on just one side, it may approximate an L-shape or a backwards L-shape, for example. As will be understood based on the present disclosure, in some such embodiments, the additional spacers may be formed on the outside of such vertical portions of the gate dielectric layer 140, for example. In some embodiments, gate dielectric 140 may include silicon dioxide and/or a high-k dielectric material, depending on the end use or target application. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 140 to improve its quality when a high-k material is used, for example. In some embodiments, gate dielectric layer 140 may include a multi-layer structure of two or more material layers. In some embodiments, gate dielectric layer 140 may include grading (e.g., increasing and/or decreasing) the content of one or more materials in at least a portion of the gate dielectric layer 140.

In some embodiments, one or more work-function layers 150 may be present to increase the interface quality between the gate dielectric 140 and subsequently deposited gate material and/or to improve the electrical properties between the gate dielectric 140 and the subsequently deposited gate material, for example. In embodiments where the one or more work-function layers 150 are present, the material of the one or more layers may include any suitable material, such as a non-metal, metal, or metal alloy material, depending on the end use or target application. However, in some embodiments, the one or more work-function layers 150 need not be present.

Figure 1E:
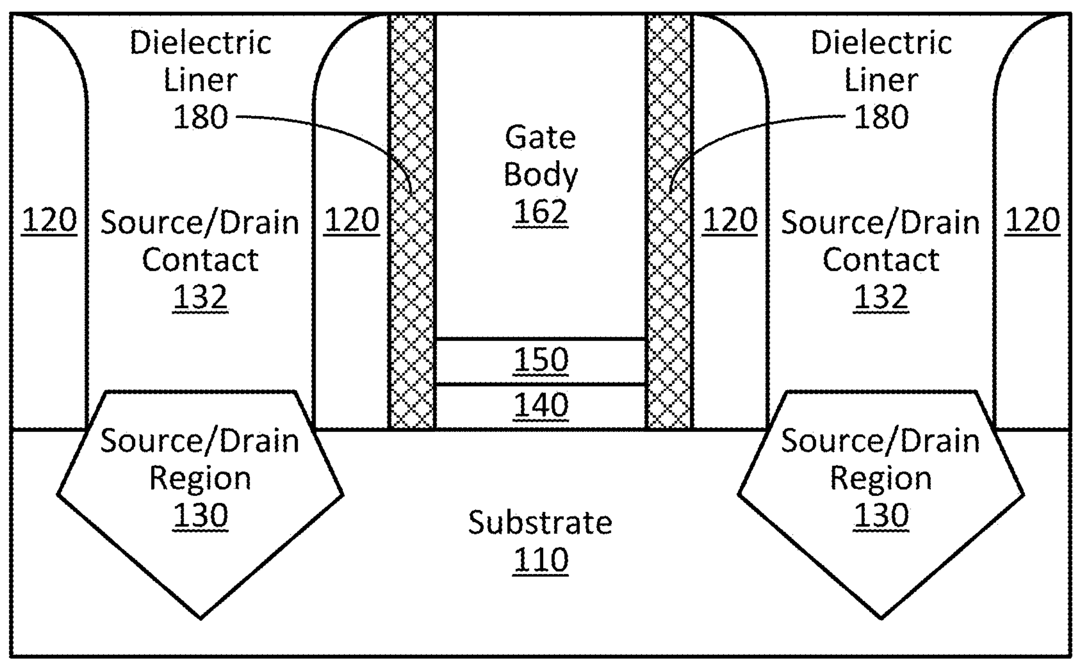

FIG. 1E illustrates an example structure after gate body 162 material has been formed in gate trench 122 and above gate dielectric 140 of the structure of FIG. 1D, in accordance with an embodiment. Note that in this example embodiment, gate body 162 is referred to as such to assist with description of the various gate components, as the final gate 160 may include gate body 162 and optionally additional gate material 164, in some embodiments, as will be described in more detail with reference to FIGS. 2C and 3B. In some embodiments, gate body 162 may be deposited or grown using any suitable processes (e.g., CVD, ALD, or PVD), and in some cases, such deposition/growth may be followed by a planarization or polish process to form the structure shown in FIG. 1E, for example. In some embodiments, the material of gate body 162 may include any suitable material, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. Continuing from the structure of FIG. 1E, in some embodiments, the dielectric liner material 180 may be kept and optionally recessed to form dielectric additional spacers 180 on either side of gate body 164, as will be described with reference to the example structures of FIGS. 1F-G, while in other embodiments, the dielectric liner 180 may be substantially or completely removed to form air gap additional spacers 280, as will be described with reference to the example structures of FIGS. 2A-B, for example. Numerous variations on the transistor structures will be apparent in light of this disclosure, and some such variations will be described with reference to FIGS. 3A-D, in accordance with some embodiments.

Figure 1F:
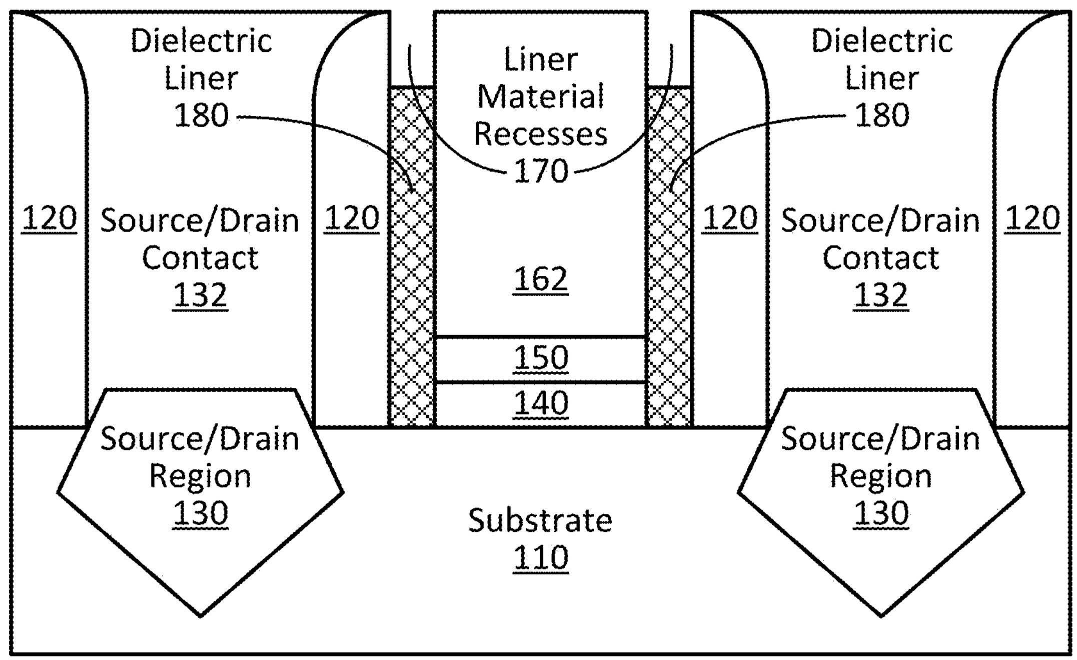

FIG. 1F illustrates an example structure after the dielectric liner 180 of FIG. 1E has been etched to form liner material recesses 170, in accordance with an embodiment. In some embodiments, the dielectric liner material 180 may be selected to have a higher relative etch rate for a given etchant than the etch rate of the selected original spacer 120 material, such that at least a portion of the dielectric liner material 180 can be selectively etched and recessed (e.g., to form the resulting structure shown in FIG. 1F). In some such embodiments, the selectivity of the etch may be such that the dielectric liner material 180 may be removed at a rate of at least 1.5, 2, 3, 5, 10, 25, 50, or 100 times faster than the material of surrounding features (e.g., original spacers 120), or some other suitable minimum relative selective etch rate, for a given etchant. Accordingly, in some such embodiments, a suitable etchant may be used to selectively remove dielectric liner material 180 to form recesses 170. In some embodiments, the recess etch depth may be controlled by total etch time and/or etch rate, or other process conditions, for example. For instance, in an embodiment, the dielectric liner material 180 may include silicon dioxide and the material of original spacers 120 may include silicon nitride, where a suitable etchant may include dilute hydrofluoric acid (DHF), to provide one specific example combination. In such an example combination, the DHF can selectively etch out the silicon dioxide liner material 180 to recess the material and form the structure of FIG. 1F, for example, or to completely remove the material, as will be described with reference to FIG. 2A, for example.

Figure 1G:
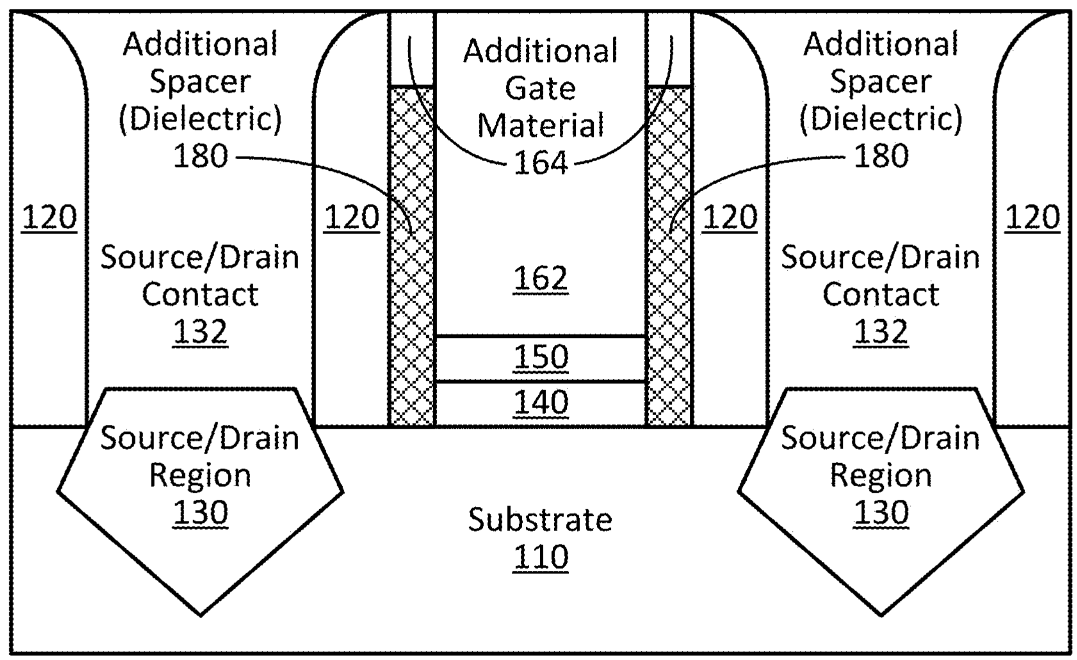

FIG. 1G illustrates an example structure after additional gate material 164 has been deposited in the liner material recesses 170 of the structure of FIG. 1F, in accordance with an embodiment. In some embodiments, additional gate material 164 may be deposited using any suitable deposition or growth process (e.g., using angled CVD, ALD, or PVD) to substantially fill the additional spacer material recesses 170, which may be optionally followed by a planarization and/or polish process, for example. In some embodiments, additional gate material 164 may include any suitable material, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. In some embodiments, additional gate material 164 may include the same material as the material of gate body 162, while in some embodiments, additional gate material 164 may include different material than the material of gate body 162. In some embodiments, additional gate material 164 may be formed to maintain gate contact area for local interconnects, which can help ensure that the structure does not pay a contact resistance penalty as a result of additional spacers 180, for example. Therefore, in some such embodiments, the gate-source/drain parasitic capacitance can be reduced with minimal or no increase in contact resistance to the gate 160. Such parasitic capacitance reduction can be achieved as a result of dielectric additional spacers 180 formed on either side of the gate, between the gate and original spacers 120, in this example embodiment.

FIG. 2A illustrates an example structure after dielectric liner 180 has been removed from the structure of FIG. 1E to form liner trenches 270, in accordance with an embodiment. As previously described, in some embodiments, the fabrication process may continue from the structure of FIG. 1E to form air gap additional spacers (as opposed to dielectric additional spacers). As was also previously described, the material of dielectric liner 180 may be selected, in some embodiments, such that it can be selectively removed (e.g., via a wet etch process) relative to surrounding materials (such as the material of original spacers 120). In this example embodiment, instead of recessing the dielectric liner material 180 (as was done to form the example structure of FIG. 1F), the dielectric liner material 180 may be substantially or completely removed to form liner trenches 270. Accordingly, in some such embodiments, a suitable etchant may be used to selectively remove dielectric liner material 180 material and form liner trenches 270. In some embodiments, the etch depth may be controlled by total etch time and/or etch rate, or other process conditions, for example.

FIG. 2B illustrates an example structure after additional gate material 164 has been deposited in the upper portion of liner trenches 270 of the structure of FIG. 2A, in accordance with an embodiment. The previous relevant description with reference to additional gate material 164 is equally applicable here. As can also be seen in FIG. 2B, in this example embodiment, depositing additional gate material 164 forms air gap additional spacers 280 on either side of gate body 162, where the additional spacers 280 are between the gate body 162 and originally formed spacers 120. In some embodiments, additional gate material 164 may be deposited using an angled deposition or growth process (e.g., using angled CVD or PVD) to form the additional gate material 164 in only an upper portion of the liner trenches 270. In some such embodiments, the deposition process may be performed at an angle in the range of, for example, 5-75 degrees relative to horizontal (major access of substrate 110), where 90 degrees relative to horizontal would represent depositing the additional gate material straight down into liner trenches 270. As can be understood based on this disclosure, in some embodiments, the angle used for the deposition process may affect the amount of additional gate material 164 formed in the upper portion of additional spacer trenches 270 and thereby affect the size of additional spacers 280. In some embodiments, a planarization and/or polish process may be performed after the angled deposition process to form the example structure of FIG. 2B.

Figure 2C:
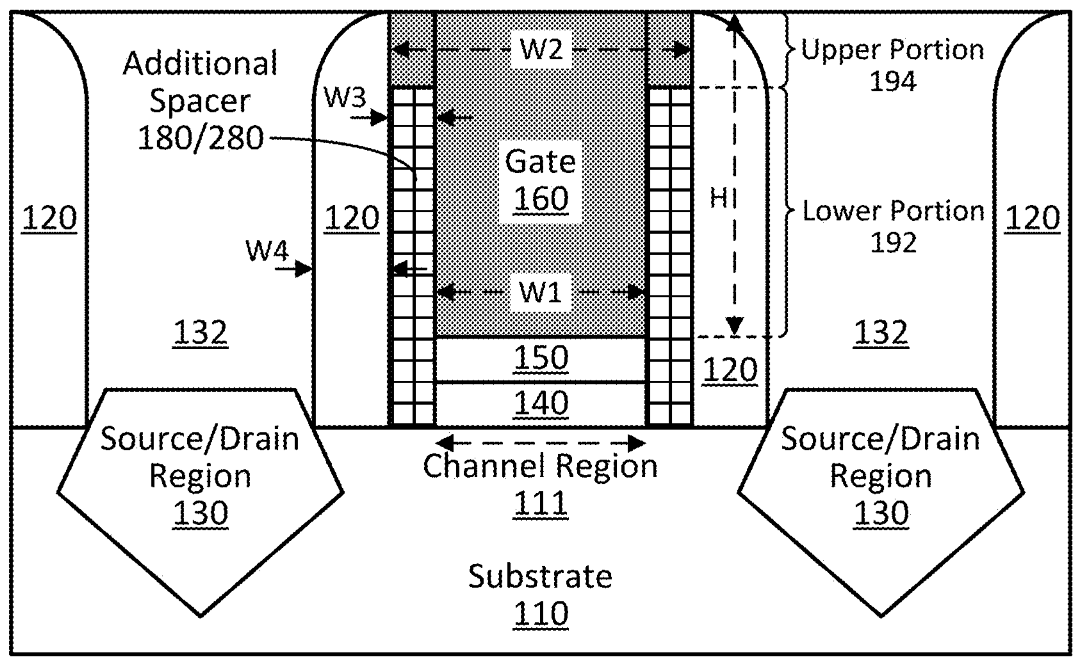
FIG. 2C illustrates the example structures of FIGS. 1G and 2B, with various dimensions, regions, and portions indicated for ease of description, in accordance with some embodiments of this disclosure.

FIG. 2C illustrates the example structures of FIGS. 1G and 2B, with various dimensions, regions, and portions indicated for ease of description, in accordance with some embodiments. Note that FIG. 2C applies to structures including both dielectric material additional spacers 180 and air gap additional spacers 280, and therefore the additional spacers regions 180/280 are indicated with different shading to indicate that the regions could include one or both of dielectric material and air gap(s). As can be seen in FIG. 2C, the gate 160 in this example embodiment includes the material of gate body 162 and additional gate material 164. Note that gate 160 includes grey shading in FIG. 2C to assist with visually identifying the gate 160 in the figure and to assist with illustrating the gate variations in FIGS. 3A-D, for example. Also note that, in some embodiments, where present, work-function layer 150 may be considered a part of gate 160, depending on the material of work-function layer 150, for example. As can also be seen in FIG. 2C, the gate 160 has been indicated to have two portions: lower portion 192 and upper portion 194. In this example embodiment, the lower portion 192 of gate 160 includes the portion of gate body 162 including additional spacers 180/280 on either side, while the upper portion 194 of gate includes the portion of gate body 162 including additional gate material 164 on either side. In this example embodiment, the width of the lower portion 192 of gate 160 between spacers 120 is indicated as width W1 and the width of the upper portion 194 of gate 160 between spacers 120 is indicated as width W2. Also note that the additional spacers 180/280 width W3 and original spacers 120 width W4 are indicated for ease of description. Only the total height H of gate 160 is indicated, but the height of various features, regions, or portions may be described herein, and such heights are the dimensions parallel to the height indicated with H. In some embodiments, the one or more additional spacers 180/280 included in the structure may be adjacent to the gate dielectric layer 140 and/or the work-function layer 150. In other words, in some embodiments, the one or more additional spacers 180/280 included in the structure may be between spacers 120 and gate dielectric 140 and/or the one or more additional spacers 180/280 may be between spacers 120 and work-function layer 150. For instance, the example structure in FIG. 2C illustrates that the additional spacers 180/280 are between the spacers 120 and the gate dielectric 140, and also illustrates that the additional spacers 180/280 are between the spacers 120 and the work-function layer 150.

In the example structure of FIG. 2C, the channel region 111 of the transistor structure is indicated to show that the width of channel region 111 approximates the width W1 of the lower portion of the gate 160. As can also be understood based on the present disclosure, the channel region 111 is generally between the source/drain regions 130 and allows current or carriers to flow between the source and drain, where such flow is regulated by gate 160, in some embodiments. Note that channel region 111 may be referred to as such, in some embodiments, whether the transistor structure is fully formed and the region is actually used as a conductive channel or whether the structure is not fully formed and the region is intended to be used as a conductive channel. In this example embodiment, channel region 111 is located in substrate 110. However, in some embodiments, the channel region 111 may be located on and/or above the substrate 110, as opposed to in it, such as in the case of a nanowire configuration (described in more detail with reference to FIG. 4). In some embodiments, the channel region 111 may be n-type, p-type, or be undoped (or minimally doped) and thus have doping intrinsic to the semiconductor material in which the region resides (i-type), depending on the end use or target application. In some embodiments, as a result of additional spacers 180/280 reducing the width W1 of the lower portion 192 of the gate 160 (e.g., as compared to structures not including the additional spacers 180/280), the width of the channel region 111 may also be effectively reduced in a similar manner.

In some embodiments, the width W2 of the upper portion 194 of gate 160 may be wider than the width W1 of the lower portion 192 of gate 160. In some such embodiments, the relatively narrower lower portion 192 of gate 160 may be as a result of the presence of additional spacers 180/280 between original spacers 120 and that lower portion 192 of gate 160 (specifically, gate body 164). For instance, as can be understood in the example structure shown in FIG. 2C, the width W2 of upper portion 194 of gate 160 in this example embodiment is the total width between spacers 120. Therefore, the inclusion of additional spacers 180/280 on either side of gate 160 and between original spacers 120, in this example embodiment, results in a reduction of the width W1 of the lower portion 192 of gate 160, such that W1 added to two times W3 (the width of additional spacers 180/280, which is the same in this example embodiment) is the same as W2, as can be seen in FIG. 2C. In some embodiments, such as embodiments where additional gate material 164 is not deposited (e.g., as will be described with reference to FIG. 3B), the width W2 of the upper portion 194 of gate 160 may be the same as (or substantially the same as) the width W1 of the lower portion 192 of the gate 160. As can also be seen in the example embodiment of FIG. 2C, additional spacers 180/270 are between original spacers 120 and gate dielectric 140, as well as between original spacers 120 and optional work-function layer 150, in this example embodiment. Therefore, in this example embodiment, the additional spacers 180/280 are on either side of gate dielectric 140 and optional work-function layer 150, such that the width of those layers is effectively reduced down from width W2 (e.g., if the structure did not include the additional spacers 180/270) to width W1. In some embodiments, the width W2 of the upper portion 194 of gate 160 may be at least 5, 10, 15, 25, or 50% wider than the width W1 of the lower portion 192, or some other suitable minimum percentage difference, for example.

In some embodiments, the width W3 of additional spacers 180/280 may be relatively wider than, narrower than, or at least approximately the same as the width W4 of spacers 120. For example, in some such embodiments, the ratio of W3:W4 may be approximately 1:1, 1.5:1, 1:1.5, 2:1, 1:2, 3:1, 1:3, or any other suitable ratio of W3:W4, depending on the end use or target application. In some embodiments, the height of upper portion 194 of gate 160 may be greater than, less than, or at least approximately the same as the height of lower portion 192 of gate 160 (in the example structure of FIG. 2C, the height of upper portion 194 is shown as less than the height of lower portion 192). In some embodiments, the height (or maximum height) of additional spacers 180/280 may be less than the height (or maximum height) of spacers 120. For instance, in some such embodiments, the height of additional spacers 180/280 may be less than 90, 75, 50, 25, or 10% of the height of spacers 120, or some other suitable maximum percentage, for example. In some embodiments, the height of additional spacers 180/280 may be greater than or at least approximately the same as the height of original spacers 120 (although, in the example structure of FIG. 2C, the height of additional spacers 180/280 is shown as less than the height of original spacers 120).

In some embodiments, the widths W1 and W2 of the lower portion 192 and upper portion 194 of gate 160, respectively, may be in the range of 50 to 500 nm, or any other suitable width, depending on the end use or target application. In some embodiments, the width W2 of the upper portion 194 of gate 160 may be at least 2, 5, 10, 15, 20, 25, or 50 nm wider than the width W1 of the lower portion 192 of gate 160, or some other suitable minimum difference, for example. In some embodiments, the widths W3 and W4 of additional spacers 180/280 and original spacers 120, respectively, may be in the range of 2 to 100 nm (e.g., 5-15 nm), or any other suitable width, depending on the end use or target application. In some embodiments, the difference in width between additional spacers 180/280 (having width W3) and original spacers 129 (having width W4) may be approximately 0, 1, 2, 3, 5, 10, 15, or 20 nm, or some other suitable difference, regardless of which features are wider, for example. In some embodiments, the total height H of gate 160 may be in the range of 50 to 500 nm, or any other suitable height, depending on the end use or target application. In some embodiments, the height of original spacers 120 may be at least 5, 10, 25, 50, 100, 150, 200, or 250 nm greater than the height of additional spacers 180/280, or some other suitable minimum difference, for example. Note that, in some example cases, the dimensions (e.g., widths or heights) described herein may be the maximum dimensions of a given feature. For instance, in some embodiments, the width of additional spacers 180/280 may vary going down the feature, such that the width W3 described herein refers to the maximum width of additional spacers 180/280 between spacers 120 and gate 160, to provide an example.

In some embodiments, the gate approximates a "T" shape, such as the approximate T-shaped gate 160 shown in the example structure of FIG. 2C. As can be understood based on this disclosure, the T-shape can be achieved through the formation of additional spacers 180/280 on either side of gate body 162 and between original spacers 120. However, in some such embodiments, the T-shape descriptor is not intended to limit such gates to an exact or perfect "T" shape. Instead, the T-shape descriptor is intended to be a general approximation of the shape of the gate, in some embodiments. For example, in some such embodiments, the left side of the T-shaped gate may not be symmetrical with the right side, for example. Note that although the original spacers 120, additional spacers 180/280, and gate 160 are illustrated in FIG. 2C as having a number of symmetries in this example embodiment (e.g., spacers 120 mirror each other, additional spacers 180/280 mirror each other, gate 160 is symmetrical about its vertical central axis, and so forth), in some embodiments, structural variations may occur as a result of desired processing and/or as a result of real-world fabrication processes. Some examples of variations that may occur will be described with reference to FIGS. 3A-D below, in accordance with some embodiments.

Figure 3A:
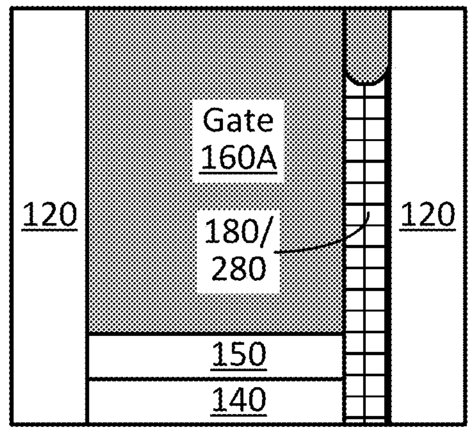
FIGS. 3A-D illustrate variations that may occur to the transistor gate of the example structure of FIG. 2C, in accordance with some embodiments of this disclosure.
Figure 3B:
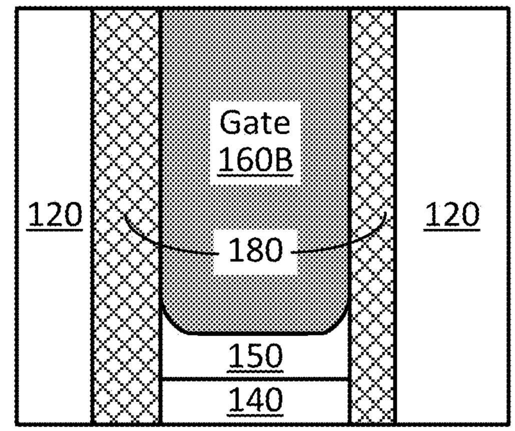

FIGS. 3A-D illustrate variations that may occur to the transistor gate of the example structure of FIG. 2C, in accordance with some embodiments. Note that only a portion of the structure of FIG. 2C including spacers 120, gate dielectric 140, optional work-function layer 150, gate 160, and additional spacers 180 and/or 270 is shown in FIGS. 3A-D to assist with illustrating variations that may occur to the transistor gate and other features. The previous relevant disclosure with reference to spacers 120, gate 160, dielectric material additional spacers 180, and air gap additional spacers 280 is equally applicable here. However, the gates in FIGS. 3A-D are indicated with their corresponding figure letter, with the gate of FIG. 3A indicated as 160A, the gate of FIG. 3B indicated as 160B, and so forth, for ease of reference. Also note that 180/280 indicates that the additional spacer may include dielectric material and/or air gap(s), as was the case with the structure of FIG. 2C. FIG. 3A is provided to illustrate that an additional spacer 180/280 may be formed on only one side of gate 160A, in some embodiments. In some such embodiments, gate 160A may approximate one horizontal half of a "T" shape, for example. FIG. 3B is provided to illustrate that additional gate material 164 may not be deposited, in some embodiments. For example, the structure of FIG. 1E may be used as the final structure for the transistor gate 160B, similar to what is shown in FIG. 3B, in accordance with some embodiments. In some such embodiments, the upper portion of a T-shaped gate may not be formed, such that the gate may more closely approximate a vertical line, for example. FIG. 3B is also provided to illustrate that the additional spacers 180 (or 280, when present) on either side of the gate 160B may have different widths, in some embodiments, such that one of the additional spacers is wider than the other one (the left additional spacer is wider, in this example case). FIG. 3B is also provided to illustrate that the original spacers 120 on either side of the gate 160B may have different widths, in some embodiments, such that one of the original spacers is wider than the other one (the right spacer is wider, in this example case). As can be understood based on this disclosure, variations can be combined in any suitable manner, such as only forming additional spacer on one side of the gate (e.g., shown in FIG. 3A) and not depositing additional gate material (e.g., shown in FIG. 3B).

Figure 3C:
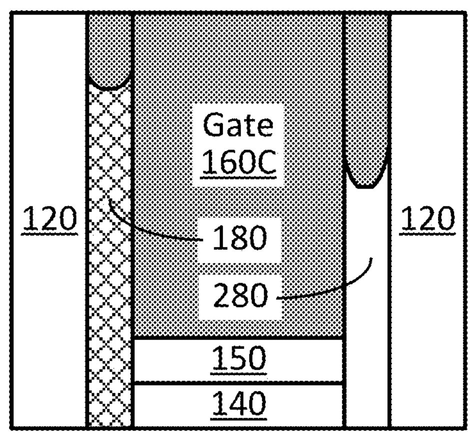
Figure 3D:
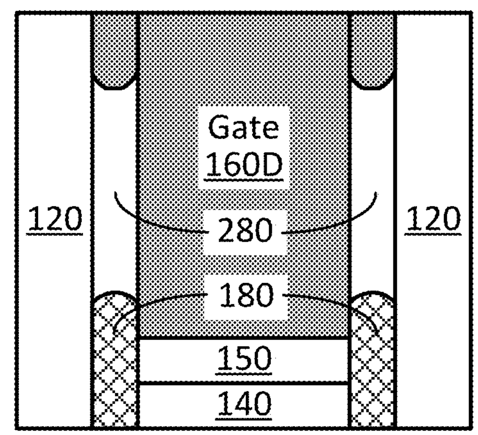

FIG. 3C is provided to illustrate that the additional spacer on one side of the gate may be a dielectric material additional spacer 180, while the additional spacer on the other side of the gate may be an air gap additional spacer 280. In addition, FIG. 3C is provided to illustrate that the additional gate material 164 may not be formed in a symmetrical manner, in some embodiments, such as is shown with example gate 160C. In the example embodiment shown in FIG. 3C, the additional gate material 164 extends to a lower point above the air gap additional spacer 280 than above the dielectric material additional spacer 180, which may be a result of the depth of the dielectric additional spacer recess 170 formed (e.g., as described with reference to FIG. 1F) and/or the specific angle used for depositing additional gate material 164, for example. FIG. 3D is provided to illustrate that multi-layer additional spacers may be formed, in some embodiments, whether desired or as a result of real-world fabrication processes. For example, as shown in FIG. 3D, dielectric material 180 is formed in a lower portion of the total additional spacer area on either side of gate 160D and air gaps 280 are formed above the dielectric material 180, resulting in additional spacers including both dielectric material 180 and air gaps 280, in this example embodiment. As previously described, the additional spacer area may include more than one material, such as two or more different dielectric materials, in some embodiments. As can also be seen in FIGS. 3A-D, the example structures include topography variations that may occur as a result of the scale of the structures (e.g., structures including nanometer critical dimensions), the fabrication processes used, and/or the desired structure being formed, for example.

FIG. 4 illustrates example non-planar transistor architectures including additional spacers, in accordance with some embodiments of this disclosure. The previous relevant disclosure with reference to features already described (e.g., substrate 110, gate dielectric 140, optional work-function layer 150, additional spacers 180/280, and so forth) is equally applicable here. However, as can be seen in the example embodiment of FIG. 4, the transistor structure includes a finned channel region 402 and a nanowire channel region 404 to illustrate two example non-planar transistor configurations that the techniques described herein can be used with. Note that the structure in this example embodiment also includes finned source/drain regions 130 and 131, where source/drain regions 130 are replacement source/drain regions and source/drain regions 131 are native to substrate 110 and include the same or similar material as substrate 110. Also note that shallow trench isolation (STI) regions 112 are shown between the set of fins in this example embodiment and may be present to assist with electrical isolation of the fins. Further note that inter-layer dielectric (ILD) material 114 is shown formed over portions of the structure, in this example embodiment, which may be used to protect the source/drain regions during gate processing, for example. In some embodiments, the STI and ILD materials may formed using any suitable techniques and may include any suitable materials, depending on the end use or target application. As shown, the example structure includes two fins, which may have been formed using any suitable techniques, such as patterning and etching substrate 110 to form the desired number of fins, and optionally etching and removing the fins to replace them with fins of different material (e.g., to form the fins used for source/drain regions 130).

As can be understood based on this disclosure, the gate (e.g., gate body 162 and additional gate material 164) is formed on three portions of the finned channel region 402 to create a finned transistor configuration. Such a finned configuration is sometimes referred to as a tri-gate, three-dimensional (3D), or finFET configuration, as the conductive channel of such finned configurations essentially resides along three different outer substantially planar regions of the fin (and thus there are three effective gates). In some embodiments, other types of non-planar transistor configurations can be achieved using the techniques described herein, such as dual-gate configurations, in which the conductive channel, for example, principally resides only along two side-walls of the fin (and not along the top of the fin). Another non-planar transistor configuration is a nanowire (also referred to as a nanoribbon or gate-all-around) configuration, which is configured similarly to a fin-based configuration, but instead of a finned channel region where the gate is on three portions, one or more nanowires are used and the gate material generally surrounds each nanowire, such as the two nanowires 404 illustrated in FIG. 4. Such nanowire configurations may be achieved, in some embodiments, by including sacrificial material in the channel region of the fin and etching out the sacrificial material prior to forming the gate stack when the channel region is exposed (e.g., prior to depositing dielectric liner material 180). In some embodiments, non-planar configurations may be used to provide benefits, such as increasing carrier mobility or increasing the effective control of the charge in the channel regions, for example.

As can be seen in the example embodiment of FIG. 4, the width Fw and height Fh of the two fins are shown as the same for ease of illustration. In some embodiments, the fins may be formed to have widths Fw in the range of 3 to 100 nm, for example, or any other suitable width depending on the end use or target application. In some embodiments, the fins may be formed to have heights Fh in the range of 5 to 100 nm, or any other suitable height depending on the end use or target application. In some embodiments, the fins may be formed with a desired approximate height Fh to width Fw ratio (Fh:Fw), such as approximately 1.5:1, 2:1, 3:1, 4:1, 5:1, or any other suitable Fh:Fw ratio, depending on the end use or target application. Note that although two fins in the example structure of FIG. 4 are illustrated as having the same widths Fw and heights Fh, the present disclosure is not intended to be so limited. For example, in some embodiments, fins formed on the same substrate or die may be formed to have varying widths and/or heights, depending on the end use or target application. Also note that although two fins are illustrated in the example structure of FIG. 4, any number of fins may be formed during the integrated circuit fabrication process, such as 1, 3, 5, 10, 100, thousands, millions, or more, depending on the end use or target application. Numerous variations and configurations will be apparent in light of this disclosure.

Example System

Figure 5:
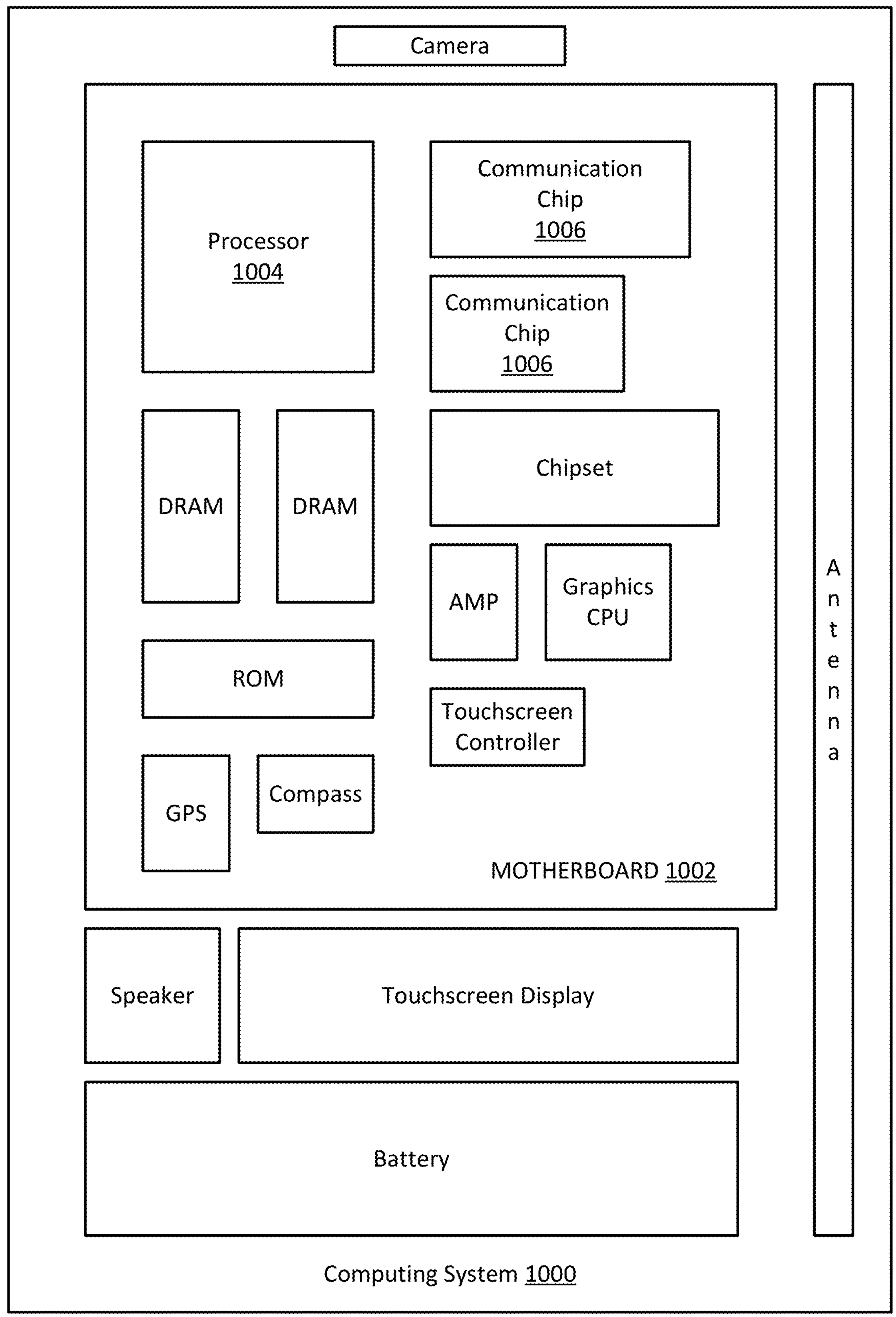
FIG. 5 illustrates a computing system implemented with integrated circuit structures or devices formed using the techniques disclosed herein, in accordance with some embodiments.

FIG. 5 illustrates a computing system 1000 implemented with integrated circuit structures or devices formed using the techniques disclosed herein, in accordance with some embodiments. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is a transistor including: a channel region; a gate above the channel region, the gate including a lower portion and an upper portion, wherein the lower portion is closer to the channel region than the upper portion; spacers on either side of the gate; and an additional spacer between one of the spacers and the lower portion of the gate.

Example 2 includes the subject matter of Example 1, wherein the upper portion of the gate is wider between the spacers than the lower portion of the gate.

Example 3 includes the subject matter of any of Examples 1-2, wherein the gate is approximately T-shaped.

Example 4 includes the subject matter of any of Examples 1-3, further including an additional spacer between the other of the spacers and the lower portion of the gate.

Example 5 includes the subject matter of any of Examples 1-4, wherein the additional spacer includes an air gap.

Example 6 includes the subject matter of any of Examples 1-5, wherein the additional spacer includes dielectric material.

Example 7 includes the subject matter of Example 6, wherein the dielectric material is a low-k dielectric material.

Example 8 includes the subject matter of any of Examples 1-7, wherein the additional spacer material is different than material of the spacers.

Example 9 includes the subject matter of any of Examples 1-8, further including a gate dielectric between the channel region and the gate.

Example 10 includes the subject matter of Example 9, wherein the additional spacer is adjacent to the gate dielectric.

Example 11 includes the subject matter of any of Examples 1-10, further including a work-function layer between the channel region and the gate.

Example 12 includes the subject matter of any of Examples 1-11, wherein the gate has a height dimension that is perpendicular to the width between the spacers and wherein the height of the lower portion of the gate is greater than the height of the upper portion of the gate.

Example 13 includes the subject matter of any of Examples 1-11, wherein the gate has a height dimension that is perpendicular to the width between the spacers and wherein the height of the upper portion of the gate is greater than the height of the lower portion of the gate.

Example 14 includes the subject matter of any of Examples 1-13, wherein the upper portion of the gate has a maximum width between the spacers that is at least 5% wider than a maximum width between the spacers of the lower portion of the gate.

Example 15 includes the subject matter of any of Examples 1-14, wherein the upper portion of the gate has a maximum width between the spacers that is at least 5 nm wider than a maximum width between the spacers of the lower portion of the gate.

Example 16 includes the subject matter of any of Examples 1-15, wherein the transistor is one of a p-type and n-type transistor.

Example 17 includes the subject matter of any of Examples 1-16, wherein the transistor includes at least one of the following configurations: planar, non-planar, dual-gate, finned, tri-gate, finned field-effect transistor (finFET), nanowire, nanoribbon, gate-all-around, metal-oxide-semiconductor FET (MOSFET), and tunnel FET (TFET).

Example 18 is a computing system including the subject matter of any of Examples 1-17.

Example 19 is a transistor including: a channel region; a gate above the channel region, the gate including a lower portion and an upper portion, wherein the lower portion is closer to the channel region than the upper portion; spacers on either side of the gate; and additional spacers, each additional spacer between the lower portion of the gate and one of the spacers; wherein the upper portion of the gate is wider between the spacers than the lower portion of the gate.

Example 20 includes the subject matter of Example 19, wherein the gate is approximately T-shaped.

Example 21 includes the subject matter of any of Examples 19-20, wherein the additional spacers include air gaps.

Example 22 includes the subject matter of any of Examples 19-21, wherein the additional spacers include dielectric material.

Example 23 includes the subject matter of Example 22, wherein the dielectric material is a low-k dielectric material.

Example 24 includes the subject matter of any of Examples 19-23, wherein the additional spacer material is different than material of the spacers.

Example 25 includes the subject matter of any of Examples 19-24, further including a gate dielectric between the channel region and the gate.

Example 26 includes the subject matter of Example 25, wherein the additional spacer is adjacent to the gate dielectric.

Example 27 includes the subject matter of any of Examples 19-26, further including a work-function layer between the channel region and the gate.

Example 28 includes the subject matter of any of Examples 19-27, wherein the gate has a height dimension that is perpendicular to the width between the spacers and wherein the height of the lower portion of the gate is greater than the height of the upper portion of the gate.

Example 29 includes the subject matter of any of Examples 19-27, wherein the gate has a height dimension that is perpendicular to the width between the spacers and wherein the height of the upper portion of the gate is greater than the height of the lower portion of the gate.

Example 30 includes the subject matter of any of Examples 19-29, wherein the upper portion of the gate has a maximum width between the spacers that is at least 5 nm wider than a maximum width between the spacers of the lower portion of the gate.

Example 31 includes the subject matter of any of Examples 19-30, wherein the transistor is one of a p-type and n-type transistor.

Example 32 includes the subject matter of any of Examples 19-31, wherein the transistor includes at least one of the following configurations: planar, non-planar, dual-gate, finned, tri-gate, finned field-effect transistor (finFET), nanowire, nanoribbon, gate-all-around, metal-oxide-semiconductor FET (MOSFET), and tunnel FET (TFET).

Example 33 is a computing system including the transistor of any of Examples 19-32.

Example 34 is a method of forming a transistor, the method including: depositing dielectric liner material above a channel region and between spacers; depositing gate dielectric material between the dielectric liner material; depositing gate material above the gate dielectric material and between the dielectric liner material; and performing at least one of: recessing the dielectric liner material to form liner recesses and depositing additional gate material in the liner recesses;

and removing the dielectric liner material to form liner trenches and depositing additional gate material in an upper portion of the trenches.

Example 35 includes the subject matter of Example 34, further including removing at least a portion of the dielectric liner material prior to depositing the gate dielectric material.

Example 36 includes the subject matter of Example 35, wherein removing the at least a portion of dielectric material is performed using an anisotropic dry etch process.

Example 37 includes the subject matter of any of Examples 34-36, further including forming a work-function layer above the gate dielectric material and between the dielectric liner material.

Example 38 includes the subject matter of any of Examples 34-37, wherein the at least one of recessing and removing the dielectric liner material is performed using a wet etch including an etchant that selectively removes the dielectric liner material.

Example 39 includes the subject matter of Example 38, wherein selectively removing the dielectric liner material includes removing the dielectric liner material at a rate of at least three times faster than removal of the spacer material.

Example 40 includes the subject matter of any of Examples 34-39, wherein the dielectric liner material includes low-k dielectric material.

Example 41 includes the subject matter of any of Examples 34-40, wherein depositing additional gate material in an upper portion of the liner trenches is performed using an angled deposition process.

Example 42 includes the subject matter of any of Examples 34-41, wherein removing the dielectric liner material to form liner trenches and depositing additional gate material in an upper portion of the liner trenches is performed to form an air gap on either side of a portion of the gate material.

Example 43 includes the subject matter of any of Examples 34-42, wherein the transistor is one of a p-type and n-type transistor.

Example 44 includes the subject matter of any of Examples 34-43, wherein the transistor includes at least one of the following configurations: planar, non-planar, dual-gate, finned, tri-gate, finned field-effect transistor (finFET), nanowire, nanoribbon, gate-all-around, metal-oxide-semiconductor FET (MOSFET), and tunnel FET (TFET).

Example 45 is a transistor including: a channel region; a gate above the channel region; a gate dielectric between the channel region and the gate; spacers on either side of the gate; and additional spacers, wherein each additional spacer is between at least a portion of the gate and one of the spacers and wherein each additional spacer is between at least a portion of the gate dielectric and the spacers.

Example 46 includes the subject matter of Example 45, wherein the additional spacers include at least one of air gaps and dielectric material.

Example 47 includes the subject matter of any of Examples 45-46, wherein the additional spacers include material different than material of the spacers.

Example 48 includes the subject matter of any of Examples 45-47, wherein each additional spacer is between only a portion of the gate and the spacers, such that the additional spacers are not between all of the gate material and the spacers.

The foregoing description of example embodiments has been presented for the purposes of illustration and description. It is not intended to be exhaustive or to limit this disclosure to the precise forms disclosed. Many modifications and variations are possible in light of this disclosure. It is intended that the scope of this disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit including at least one transistor, the integrated circuit comprising:

a body including semiconductor material;

a source region and a drain region, the body between the source and drain regions, the source and drain regions including semiconductor material and dopant;

a gate structure at least above the body, the gate structure including one or more metals, the gate structure having a narrower lower portion and a wider upper portion, the narrower lower portion closer to the body than the wider upper portion;

a gate dielectric between the body and the gate structure;

a first spacer and a second spacer, the first and second spacers including one or more dielectrics, the gate structure between the first and second spacers, the gate dielectric between the first and second spacers; and an airgap laterally between the first spacer and the narrower lower portion of the gate structure, the airgap also located below the wider upper portion of the gate structure such that the wider upper portion of the gate structure defines an upper boundary of the airgap.

2. The integrated circuit of claim 1, wherein the gate structure is approximately T-shaped.

3. The integrated circuit of claim 1, wherein the narrower lower portion of the gate structure has the same width between the first and second spacers as the gate dielectric.

4. The integrated circuit of claim 1, wherein the vertical height of the narrower lower portion of the gate structure is greater than the vertical height of the wider upper portion of the gate structure.

5. The integrated circuit of claim 1, wherein the vertical height of the wider upper portion of the gate structure is greater than the vertical height of the narrower lower portion of the gate structure.

6. The integrated circuit of claim 1, wherein the wider upper portion of the gate structure has a maximum width between the first and second spacers that is at least 5% wider than a maximum width between the first and second spacers of the narrower lower portion of the gate structure.

7. The integrated circuit of claim 1, wherein the wider upper portion of the gate structure has a maximum width between the first and second spacers that is at least 5 nanometers wider than a maximum width between the first and second spacers of the narrower lower portion of the gate.

8. The integrated circuit of claim 1, wherein the body is a fin, the fin between two portions of the gate structure.

9. The integrated circuit of claim 1, wherein the gate structure is around the body.

10. A computing system comprising the integrated circuit of claim 1.

11. The integrated circuit of claim 1, further comprising a layer between the gate dielectric and the gate structure, the layer including one or more metals, the layer including compositionally different material from the gate structure.

12. The integrated circuit of claim 11, wherein the layer, the narrower lower portion of the gate structure, and the gate dielectric all have the same width between the first and second spacers.

13. The integrated circuit of claim 1, further comprising a third spacer below the airgap and positioned laterally between the first spacer and the narrower lower portion of the gate structure, the third spacer including compositionally different material from the first spacer.

14. The integrated circuit of claim 13, further comprising a fourth spacer positioned laterally between the second spacer and the narrower lower portion of the gate structure.

15. The integrated circuit of claim 14, wherein the fourth spacer defines a second airgap positioned laterally between the second spacer and the narrower lower portion of the gate structure, and the second airgap is also positioned vertically between the wider upper portion of the gate structure and the fourth spacer such that the wider upper portion of the gate structure defines an upper boundary of the second airgap.

16. The integrated circuit of claim 14, wherein the wider upper portion of the gate structure is above and in direct contact with the third spacer.

17. The integrated circuit of claim 14, wherein the third spacer and the fourth spacer each includes one or more dielectrics.

18. The integrated circuit of claim 17, wherein the one or more dielectrics included in the third spacer and the fourth spacer each includes a low-k dielectric.

19. An integrated circuit including at least one transistor, the integrated circuit comprising:

a body including semiconductor material;

a source region and a drain region, the body between the source and drain regions, the source and drain regions including semiconductor material and dopant;

a first spacer and a second spacer, the first and second spacers including one or more dielectrics;

a gate structure at least above the body, the gate structure including one or more metals, the gate structure between the first and second spacers, the gate structure including an upper portion and a lower portion, the lower portion of the gate structure closer to the body than the upper portion of the gate structure, wherein the upper portion of the gate structure has a larger width between the first and second spacers than the lower portion of the gate structure; and a gate dielectric between the body and the gate structure;

wherein the integrated circuit defines an airgap (i) laterally between the first spacer and the lower portion of the gate structure and/or (ii) laterally between the second spacer and the lower portion of the gate structure, the airgap below the upper portion of the gate structure such that the upper portion of the gate structure defines an upper boundary of the airgap.

20. The integrated circuit of claim 19, further comprising a third spacer between the first spacer and the lower portion of the gate structure, the third spacer absent between the first spacer and the upper portion of the gate structure.

21. The integrated circuit of claim 20, wherein the airgap is laterally between the first spacer and the lower portion of the gate structure such that the third spacer defines a lower boundary of the airgap.

* * * * *